United States Patent [19]

Frank

[11] Patent Number: 5,182,424
[45] Date of Patent: Jan. 26, 1993

[54] MODULE ENCAPSULATION BY INDUCTION HEATING

[76] Inventor: Vlastimil Frank, Rte. 4, Box 113, Warrenton, Va. 22186

[21] Appl. No.: 429,889

[22] Filed: Oct. 31, 1989

[51] Int. Cl.⁵ .......................................... B23K 13/02
[52] U.S. Cl. ........................... 219/10.53; 219/10.75; 219/10.79; 219/10.491; 437/180; 437/219; 257/697; 174/52.4; 174/52.2
[58] Field of Search ............... 219/10.53, 10.75, 10.79, 219/10.491, 121.69, 121.64; 156/60, 69, 272.2, 274.2, 282, 381, 382, 285, 643, 650; 437/180, 182, 209, 218, 220, 219; 174/52 PE, 15, 16 HS, 52 FP; 29/588, 622, 25.35; 357/70, 71, 81, 80

[56] References Cited

U.S. PATENT DOCUMENTS

| | | | |
|---|---|---|---|
| 3,536,568 | 10/1970 | Rothstein | 219/10.53 |
| 3,651,299 | 3/1972 | O'Neill | 219/10.53 |
| 3,706,176 | 12/1972 | Leatherman | 219/10.53 |
| 3,808,074 | 4/1974 | Smith et al. | 219/10.53 |
| 3,993,123 | 11/1976 | Chu et al. | 165/80 |
| 4,069,498 | 1/1978 | Joshi | 357/81 |
| 4,079,511 | 3/1978 | Grabbe | 29/627 |
| 4,218,578 | 8/1980 | Olschewski et al. | 174/35 R |
| 4,251,852 | 2/1981 | Ecker et al. | 361/386 |
| 4,259,436 | 3/1981 | Tabuchi et al. | 430/414 |
| 4,355,463 | 10/1982 | Burns | 29/827 |
| 4,380,484 | 4/1983 | Repik et al. | 219/10.53 |
| 4,392,992 | 7/1983 | Paulson et al. | 252/512 |
| 4,400,870 | 8/1983 | Islam | 29/588 |
| 4,552,300 | 11/1985 | Zovko et al. | 228/20 |
| 4,558,171 | 12/1985 | Gantley et al. | 174/52 |
| 4,701,999 | 10/1987 | Palmer | 437/211 |
| 4,814,943 | 3/1989 | Okuaki | 361/400 |
| 4,820,658 | 4/1989 | Gilder et al. | 437/209 |

FOREIGN PATENT DOCUMENTS

| | | |
|---|---|---|
| 57-90964 | 9/1982 | Japan . |
| 58-218166 | 4/1984 | Japan . |
| 59-88016 | 4/1986 | Japan . |
| 60-249349 | 4/1986 | Japan . |

OTHER PUBLICATIONS

John Davies & Peter Simpson, McGraw Hill, London 1979 The Inducting Heating Handbook, Chapter 1,4,9,12 & 13.

*Primary Examiner*—Bruce A. Reynolds
*Assistant Examiner*—Tu Hoang

[57] ABSTRACT

An induction heating module encapsulation apparatus and method for its use is disclosed. The apparatus comprises a substantially airtight chamber which is composed of ceramic or some other high temperature insulating material in which a cap and a ceramic substrate having semiconductor chips joined thereon are placed. A sealband of solder or other brazing material is placed at the periphery of the cap where the cap end substrate are to be joined. An RF coil, which serves as inductor in the apparatus, is energized by a high frequency generator, generating an electromagnetic field in the radio frequency spectrum. The RF coil is oriented to localize the inducted current at the periphery of the cap and the sealband. The inducted current is dissipated in the form of heat until the sealband is molten. The RF power is then turned off. The chamber is pressurized at this point to prevent heated air underneath the cap from breaching the integrity of the sealband by escaping through the sealband while it is in its molten state. After the sealband has been allowed to cool sufficiently to solidify, the pressure is reduced and the completed module is removed from the chamber. The entire encapsulation process requires ten to fifteen seconds per module assembly.

7 Claims, 5 Drawing Sheets

MODULE ENCAPSULATION BY INDUCTION HEATING

BACKGROUND OF THE INVENTION

1. Technical Field

Generally, the present invention relates to the encapsulation of semiconductor chips on ceramic modules with a protective cap. More particularly, it relates to an apparatus for and a method using the apparatus for the encapsulation of the ceramic substrate through the use of radio frequency induction heating.

2. Background Art

In the fabrication of a modern computer, one or more semiconductor chips which provide the main logic and memory circuits for the computer are electrically connected to a ceramic substrate. The ceramic substrate is in turn electrically connected to a printed circuit board and several circuit boards in the computer.

Before the ceramic substrate is mounted on the circuit board, it is encapsulated by covering the semiconductor chips on the substrate with a protective cap, generally composed of a metallic material, which is bonded to the periphery of the ceramic substrate. The assembled ceramic substrate and metallic cap combination is called a module or module assembly. In the prior art, the encapsulation process requires large and expensive tooling, as well as a considerable amount of process time and operator attention. To attach a metallic cap to the ceramic substrate, a metallic sealband, typically of tin solder, silver solder or other suitable brazing material, is applied to the periphery of the substrate. The sealband must be flattened by placing a ceramic weight on the sealband and running the substrate-weight combination through a finely controlled furnace. Next, after removing the ceramic weight, a thermal paste is dispensed into the cap. A capping tool then positions the metallic cap onto the substrate. The thermal paste acts as a thermal bridge between the semiconductor chips on the substrate and the cap to aid in heat dissipation through the cap. A capping fixture is then attached around the cap and substrate to apply the necessary pressure for the bonding operation. The substrate-cap-capping fixture combination is subsequently run through another finely controlled conveyor furnace with an inert atmosphere. In the prior art method, the bonding operation is quite slow as both the module assembly and the capping fixture must be heated to the reflow temperature by means of convection heating. After the module is assembled, it undergoes a series of electrical and physical tests to determine whether all components are operating and have been assembled correctly. Occasionally, a module fails testing. The failed module is then disassembled by running through the conveyor furnace and those parts which are fully functional are salvaged for other modules.

The prior art encapsulation process described above is time consuming, expensive, and requires a significant amount of floor space in the semiconductor fabrication line. For example, a single conveyor furnace measures 25 feet long by 3 feet wide, and 5 feet high, requires constant temperature profiling throughout its lifetime. The combined sealband flattening and module bonding processes in such a furnace require an average of 40 minutes for each module. The furnaces, once profiled, remain continuously powered and are continuously purged with nitrogen or another inert gas; over time, both the power and purging gas represent significant operating costs. Further, as floor space on a semiconductor fabrication line is generally figured at $100 per square foot per annum, the size of the tool alone represents a significant cost factor. Adding yet further to the costs of the prior art encapsulation method are the multitude of capping fixtures which must be built to obtain a sufficiently high throughput. The capping fixtures must be specially made for each type of module assembly manufactured in the line.

Finally, in addition to the cost problems associated with the prior art process discussed above, as the entire module assembly heats up, there is a potential manufacturing problem: the solder connections which hold the semiconductor chips to the ceramic substrate could reach a sufficiently high temperature to melt. Thermal fatigue is a particular problem when the module is reworked several times.

SUMMARY OF THE INVENTION

It is therefore an object of the present invention to reduce the process time an costs for an encapsulation operation.

It is another object of the present invention to eliminate the need for large, expensive conventional furnace in the module encapsulation process.

It is a further object of the present invention to eliminate the need for specialized capping fixtures and capping tools in an improved encapsulation method.

It is yet a further object of the present invention to reduce the energy and purging gas requirements for a module encapsulation operation.

It is still another object of the present invention to reduce the semiconductor line floorspace required for the tooling associated with an encapsulation operation.

These objects and others are achieved by an apparatus and improved method for module encapsulation by induction heating. The apparatus has a substantially airtight chamber in which the ceramic substrate and cap are placed. An RF coil, acting as the inductor in the apparatus, is oriented so that the RF current induced in the cap is localized at the lip of the cap and the sealband area. A gas inlet port is connected to the chamber to compensate for the increase in air pressure from heated air under the cap to preserve the integrity of the molten sealband.

In the preferred embodiment, the encapsulation apparatus is constructed in two major assemblies, a stationary upper assembly which includes an RF coil to provide the induction heating effect and a lower assembly having a insulator nest composed of a ceramic or other high temperature insulator, in which the ceramic substrate and cap are placed. The ceramic nest rests on a tool lift carriage which lifts and lowers the entire lower assembly to contact and disengage form the upper assembly. The components of the upper assembly are mounted on a rigid tool frame. In addition to the RF coil, the upper assembly comprises a chamber plate, a ceramic upper pressure plate and an insulator plate. When the lower assembly is lifted to the closed position in contact with the upper assembly, the ceramic nest mates with the chamber plate and the ceramic upper pressure plate to form a small chamber in which the bonding process takes place. The ceramic upper pressure plate contacts the cap and provides the pressure necessary to assure a good bond with the substrate. Once the solder sealband has been melted by the RF current inducted into the cap and sealband by the RF coil.

The improved encapsulation method commences with placement of a ceramic substrate and metallic cap in the ceramic nest of the lower assembly while the apparatus is in an opened position. The ceramic substrate is provided with a sealband, preferably made of a solder-like material. The lower assembly is lifted into a closed position so that the ceramic nest is mated with the chamber plate and the ceramic upper pressure plate presses against the metallic cap. The RF coil is energized and produces an electromagnetic field which induces a current in the metallic cap, and sealband if the sealband is composed of a metallic material. The sealband is melted by the heated cap within a few seconds. When the reflow temperature of the sealband is reached, the RF coil is turned off. As the air trapped inside the cap is also heated, pressured nitrogen, or another gas, is introduced to pressurize the chamber, equalizing the pressure on each side of sealband and thereby maintaining the integrity of the sealband. Within a few seconds, the module assembly is lowered to the opened position and the completed module is removed from the apparatus.

BRIEF DESCRIPTION OF THE DRAWINGS

The above as well other objects and features of the present invention will be more clearly understood by reference the following figures and accompanying description.

DESCRIPTION OF THE BEST MODE FOR CARRYING OUT THE INVENTION

Induction heating is a method of raising the temperature of an electrically conductive material. Based on the 1831 discoveries of Michael Faraday, the temperature of a conductive material can be raised by subjecting it to an alternating electromagnetic field. The electrical currents induced in the conductive material dissipate power in the form of heat. A water filled coil, or inductor, acts as the primary winding of a transformer and surrounds the material to be heated which acts as the secondary winding. Alternating currents flowing in the primary coil induce eddy currents in the conductive material causing it to be heated. The depth to which the eddy currents penetrate the conductive material depends on a complex relationship between the frequency of the alternating current in the inductor, the workpiece dimensions, and the magnetic permeability and resistivity of the conductive material.

For soldering or brazing applications such as the encapsulation process of the present invention, it is known that an alternating electromagnetic field in the radio-frequency (RF) spectrum of between 50 kHz to 10 MHz is most suitable. In such an induction heating system, an RF coil is used as the inductor to produce very shallow eddy current depths (0.1 mm) and localized heating at fast rates. In general, the higher the RF frequency, the shallower the eddy current and the more localized the heating effect. A more complete understanding of the physics of induction heating is found in the *Inducting Heating Handbook*, by John Davies and Peter Simpson, McGraw-Hill, London, 1979. Chapters of particular relevance for the present invention include chapters 1, 4, 9, 12 and 13.

Figure 1:
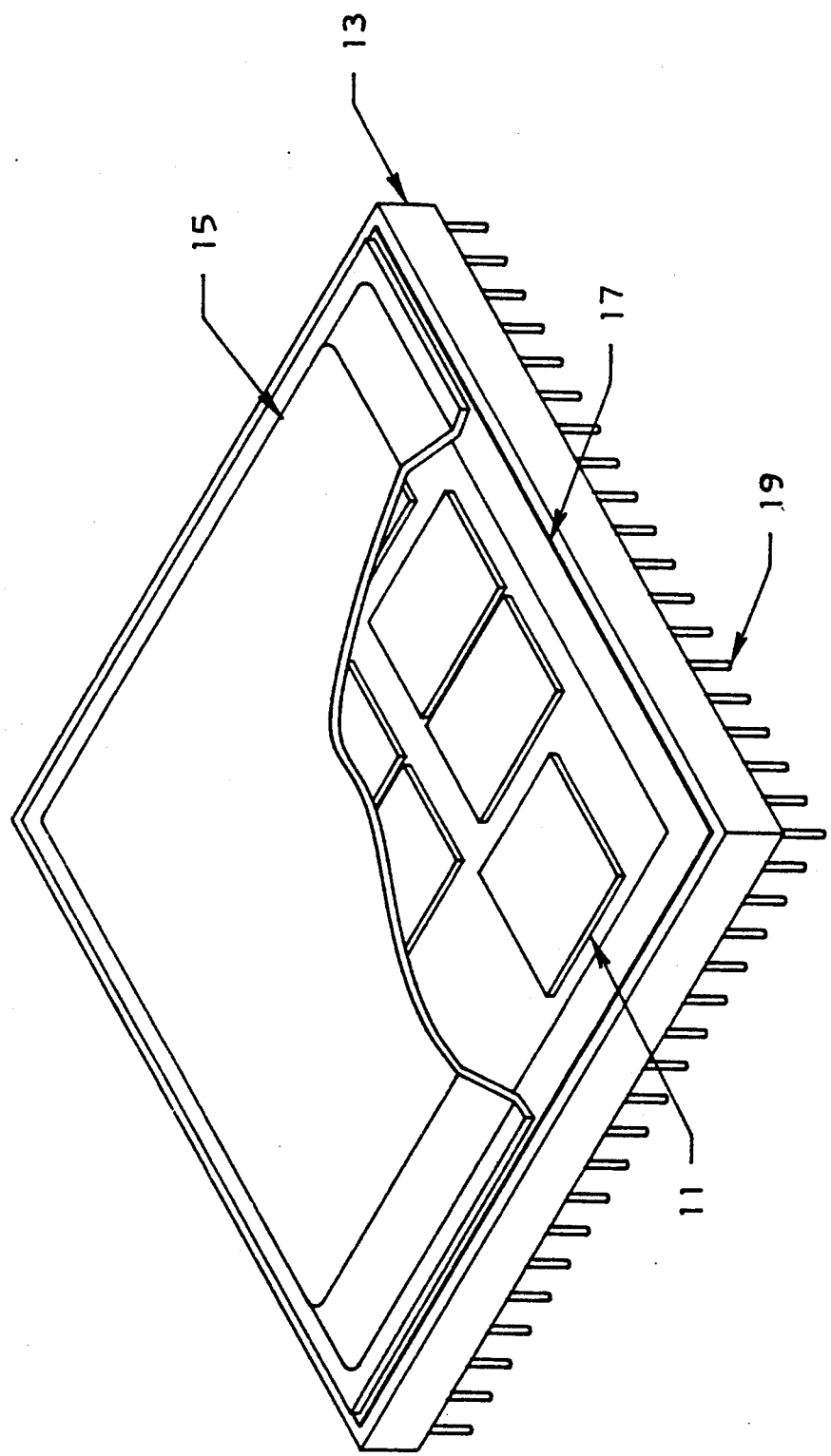
FIG. 1 is a perspective view of a completed ceramic module assembly including a ceramic substrate and semiconductor chips and metallic cap mounted thereto.

Referring to FIG. 1, a perspective view of a completed ceramic module assembly depicted. Semiconductor chips 11 are electrically connected to the top of the ceramic substrate 13 by means of small solder balls. The solder balls are attached to pads on both the chips 11 and substrate 13. For more information on the joining process between the semiconductor chips and the ceramic substrate, refer to commonly assigned U.S. Pat. No. 4,360,142 entitled "Method of Forming a Solder Interconnection Capable of Sustained High Power Levels Between a Semiconductor Device and a Supporting Substrate" by Carpenter et al., which is incorporated herein by reference. The protective cap 15 is bonded to the periphery of the top of the substrate 13 by means of a sealband 17. The ceramic substrate 13 typically has a metallization feature on its top surface shaped like the sealband 17 and lip of the cap 15 to assure a good bond. The sealband 17 is preferably composed of a solder-like material, for example, a lead-tin or silver solder, and can be made of any brazing material compatible with the module assembly. The substrate 13 and cap 15 depicted in FIG. 1 measure 50 mm by 50 mm, however, the present invention can readily adapted to smaller and larger modules. A thermal paste provides a thermal bridge between the semiconductor chips 11 and the cap 15. On the bottom of the ceramic substrate 13, connector pins 19, numbering approximately a hundred or more, are fixed to provide electric contact from the ceramic substrate 13 to a circuit board (not shown). The present invention will perform equally well with a substrate composed of a conventional ceramic material or the newer glass-ceramic materials to which the semiconductor industry is evolving. In the nomenclature of the present application, the term "ceramic" is used to be inclusive of both these types of substrates.

In theory, the induction heating effect of the present invention could be used with a nonmetallic cap, inducting the RF current into the sealband 17 alone. In practice, because of concerns of the effects of RF field on the circuitry in the semiconductor chips 11 and ceramic substrate 13, it is preferable to use a weaker RF field and rely on the induction heating effects of the field on cap 15 of which at least the cap lip is metallic. The heat generated in the cap 15 will flow to help the sealband 17 reach reflow temperature. In addition, the use of a metallic cap 15 shields the semiconductor and substrate circuitry from the RF induced field. When a metallic cap or a cap with a metallic lip is used, it is possible to use a thermoplastic, epoxy-based plastic alloy, or other polymer material for the sealband 17. The heat generated by the RF current induced in the cap 15 can conduct heat to the polymer sealband 17 until it reaches its reflow temperature, despite the fact that no current is induced in the sealband 17 itself. The use of a polymer material for the sealband would have the advantage of a lower melting point or reflow temperature, thus further reducing the chance of affecting the solder joints between the substrate 13 and the chips 11. The main disadvantages associated with a polymer sealband are compatibility issues with the other materials in the module assembly.

Figure 2:
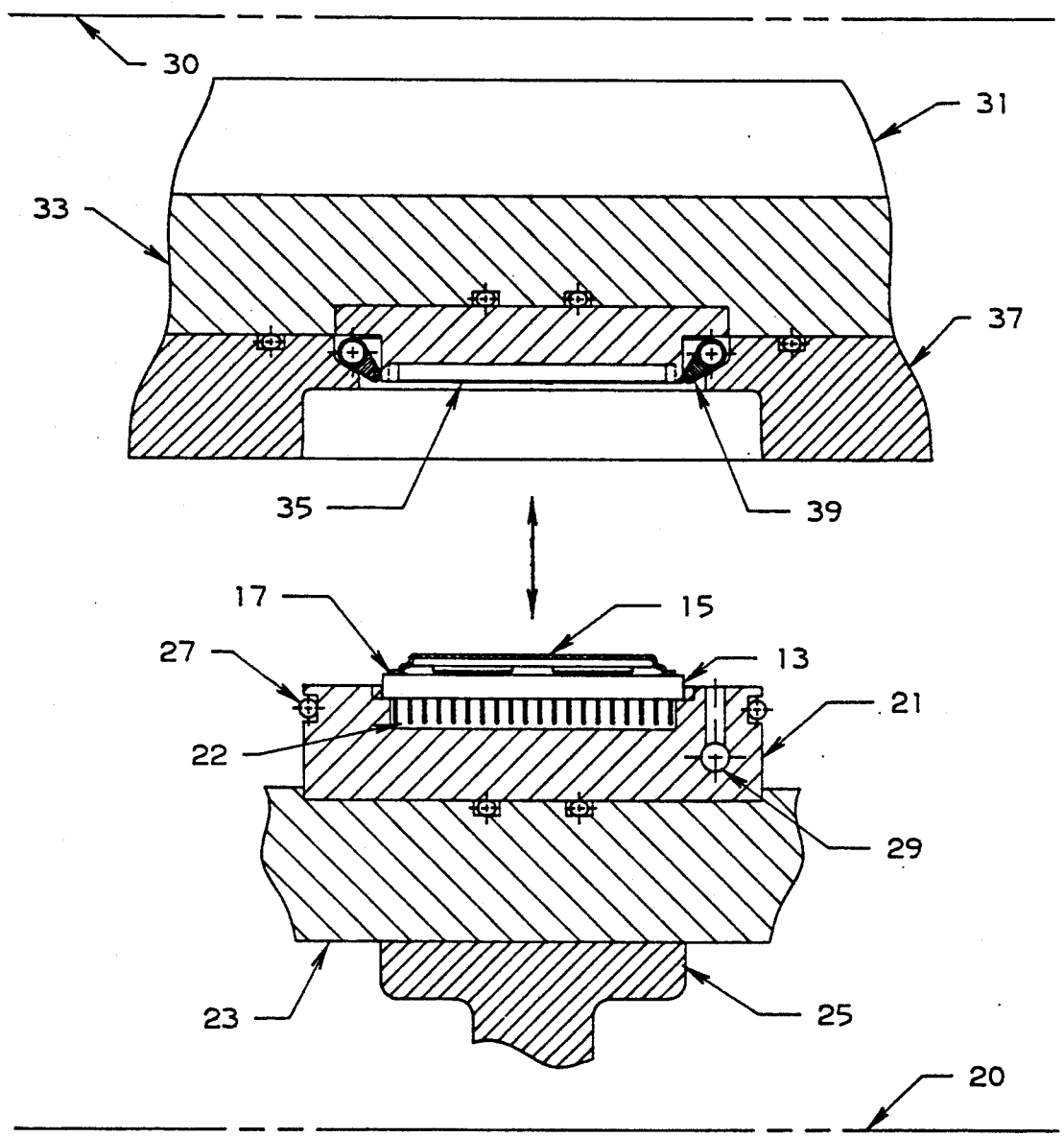
FIG. 2 is a cross sectional view of the RF encapsulation apparatus in the opened position.

In FIG. 2, a cross section view of the RF encapsulation apparatus in the opened position is shown. The apparatus is quite compact; with the RF generator and the heat exchanger (both not shown), it measures approximately 3 feet wide by 2 feet in depth by 2½ feet high. The apparatus replaces three conveyor furnaces which would require about 500 square feet in floor space, realizing a great savings in floor space in the semiconductor line. Ceramic substrate 13 and cap 15 are shown positioned in the ceramic nest 21 is removable from lower assembly 20. An 0-ring 27 helps seal the chamber when the RF encapsulation apparatus is in the closed position, and a gas inlet port 29 which provides a pressurized gas mixture to the chamber during the bonding process are also shown in the lower assembly 20.

The upper assembly 30 of the RF encapsulation apparatus is anchored by the tool frame 31 to which the other components are mounted. The insulator plate 33 is attached directly to the bottom of the tool frame 31. Attached to the bottom of the insulator plate 33 is the ceramic upper pressure plate 35 and the chamber plate 37. Also included in the upper assembly is an RF coil 39 in the encapsulation apparatus which inducts the RF current into the lip of the cap 15 located over the sealband 17. The ceramic upper pressure plate 35 is located over the lip of the cap 15. The ceramic upper pressure plate 35, like the ceramic nest 21, is reconfigured for each size and type of substrate 13 and cap 15 to be encapsulated. If the difference in the size of the various substrates is great, then the RF coil 39 will also be replaced to assure that the RF current will be concentrated in the sealband 17 area. The nest 21, upper pressure plate 35 and chamber plate 37 are not necessarily composed of the ceramic material, but they must be made of an insulator material to avoid coupling with a RF coil 39. The insulator also must be able to withstand the temperatures of 200 to 300 degrees centigrade needed to reach the reflow temperature of a solder sealband 17. The insulator plate 33 is not subjected to these temperatures and can be readily be made of a relatively low melting plastic.

Figure 3:
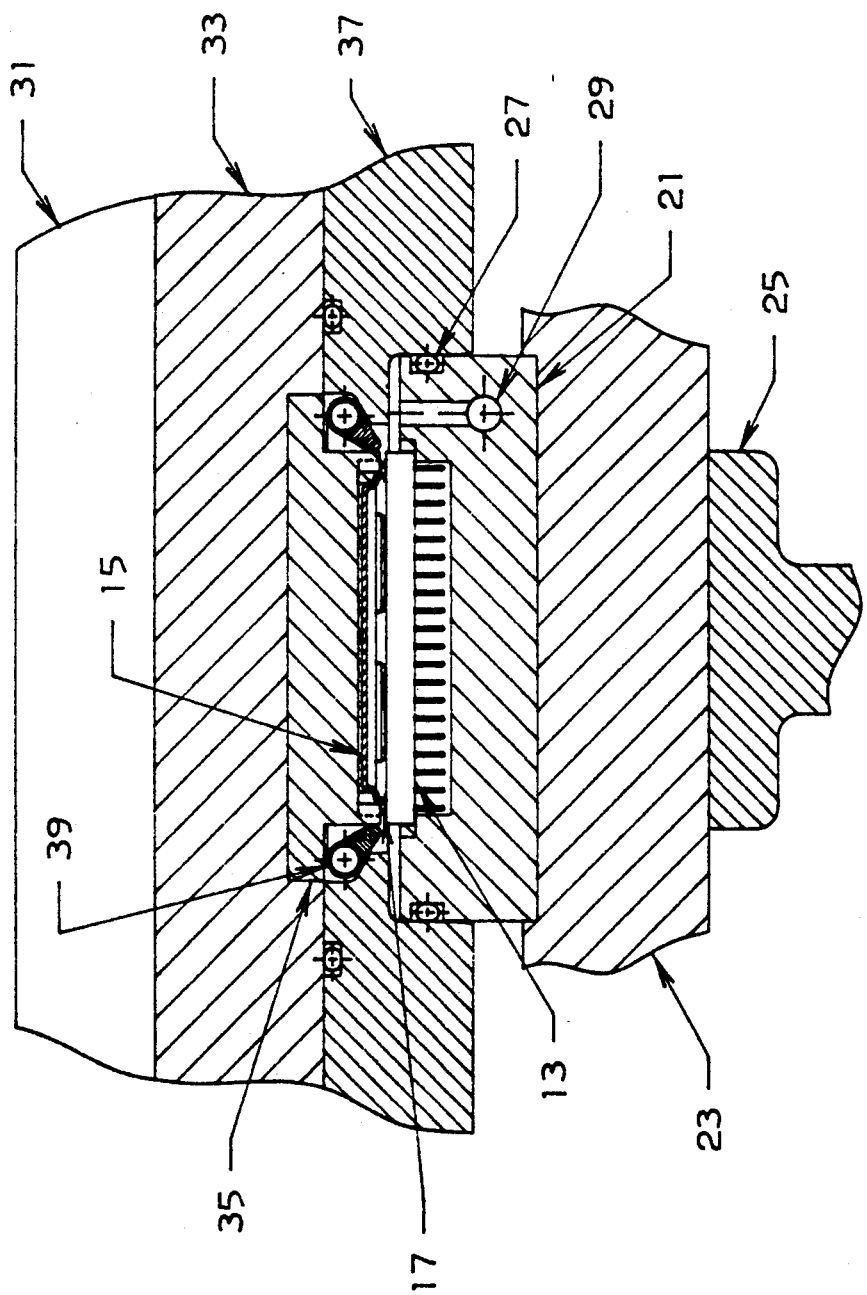
FIG. 3 is a cross sectional view of the RF encapsulation apparatus in the closed position.

The RF encapsulation apparatus cross section in the closed position is depicted in FIG. 3. The ceramic nest 21 mates with the ceramic upper pressure plate 35 and the chamber plate 37 to form the small chamber in which the bonding process takes place. The O-ring 27 helps seal the chamber. When the lower assembly 20 is lifted in place, the ceramic upper pressure plate 35 provides the pressure on the metal cap 15 necessary to create a good bond at the sealband 17, thus eliminating the need for the multitude of specialized capping fixtures and capping tools associated with prior art encapsulation processes. Depending on the size of the cap 15 and substrate 13, the necessary clamping force exerted by the ceramic upper pressure plate 35 is in the range of 4 to 30 kilograms.

After the lower assembly 20 is lifted to the closed position, RF current from a high frequency generator (not shown) is supplied to the RF coil 39. In the preferred embodiment of the invention the apparatus operates at an RF frequency of between 400 kHz to 600 kHz, at approximately 2000 volts and at a power of 2 kilowatts. In this embodiment, the cap 15 is made of a low expansion alloy such as Invar, a steel alloy made of 63.7% iron, 36% nickel, and 0.3% molybdenum, clad in inner and outer layers of copper. Including the copper cladding, the lip of a 50 mm by 50 mm cap measures approximately 0.66 mm in thickness. The sealband 17 is composed of 60/40 lead/tin solder which has a reflow temperature of 194° C. and is 6 mils in thickness. The clamping force for a 50 mm by 50 mm cap 15 and substrate 13 is on the order of 17-20 kilograms. The RF current is induced into the metallic cap 15 and solder sealband 17. The sealband 17 is melted within a few seconds, largely from the heat generated in the metallic cap 15 and conducted into the sealband 17 by heat transfer effects. The solder sealband 17 bonds to the metallization feature of the ceramic substrate 13 and the metallic lip of the cap 15. One skilled in the induction heating art would recognize that the choice of cap and sealband material, the size of the cap 15 and the configuration of the RF coil 39 and its concentrator 43 can have a large effect on the choice of these parameters. When the reflow temperature is reached, the RF generator is turned off.

As the air trapped inside the cap 15 is also heated, it has a tendency to expand. Since the cap 15 is held in place by the pressure plate 35, the only place for the air to escape is through the molten solder sealband 17. The escape of the air will create a small hole or series of small holes in the sealband 17 if not prevented. Holes in the sealband 17 are normally not acceptable as one of the prime functions of the cap 15 is to prevent the environment from coming in contact with the semiconductor chips 11. The water vapor and oxygen present in air would cause corrosion and other reliability problems. To eliminate such blow holes, in the preferred embodiment, a pressurized inert gas of about six to eight psi is purged through the gas inlet port 29 to equalize gas pressure on both sides of the sealband 17 until it has solidified. For the purposes of the present invention, an inert gas is one which will not react with the solder 17, or other materials on chips 11 and substrate 13 such as nitrogen, helium or argon.

If the gas is introduced after the sealband 17 is molten, but before any blowholes are created, it is not necessary that the gas be inert as the chips 11 and substrate 13 are already sealed from the environment by the molten sealband 17. However, an inert gas is preferred if the gas is to be or could possibly be introduced before the sealband is molten. After a few seconds, the sealband 17 has cooled sufficiently to solidify and the gas pressure is released. Although the gas inlet port 29 is located in the ceramic nest 21 in this particular embodiment, its exact placement is not material to the invention so long as access to the chamber is provided. For example, to automate the placement of the substrate 13 and cap 15 on the lower assembly, it might be desirable to utilize a plurality of ceramic nests 21 as removable fixtures which accompany the module assembly through the line. The gas inlet port 29 would be located in the chamber plate 37 in such an automated embodiment.

After the pressure is released, the lower assembly 20 is lowered and the finished module assembly is unloaded from the RF encapsulation apparatus. Although the throughput of the encapsulation apparatus is dependent on a number of factors including the size of the substrate 13, cap 15 and sealband 17, the power of the RF current supplied to the RF coil 39 and the brazing material used in the sealband 17, normal cycle time for a single module assembly following the preferred embodiment described above would be on the order of 10 to 15 seconds.

This is far faster than the 25 to 30 minutes required for bonding by the prior art methods. Also, the present invention does not require the sealband flattening operation of the prior art which required an additional 15 to 20 minutes and its own specialized ceramic weights.

Figures 4A, 4B:
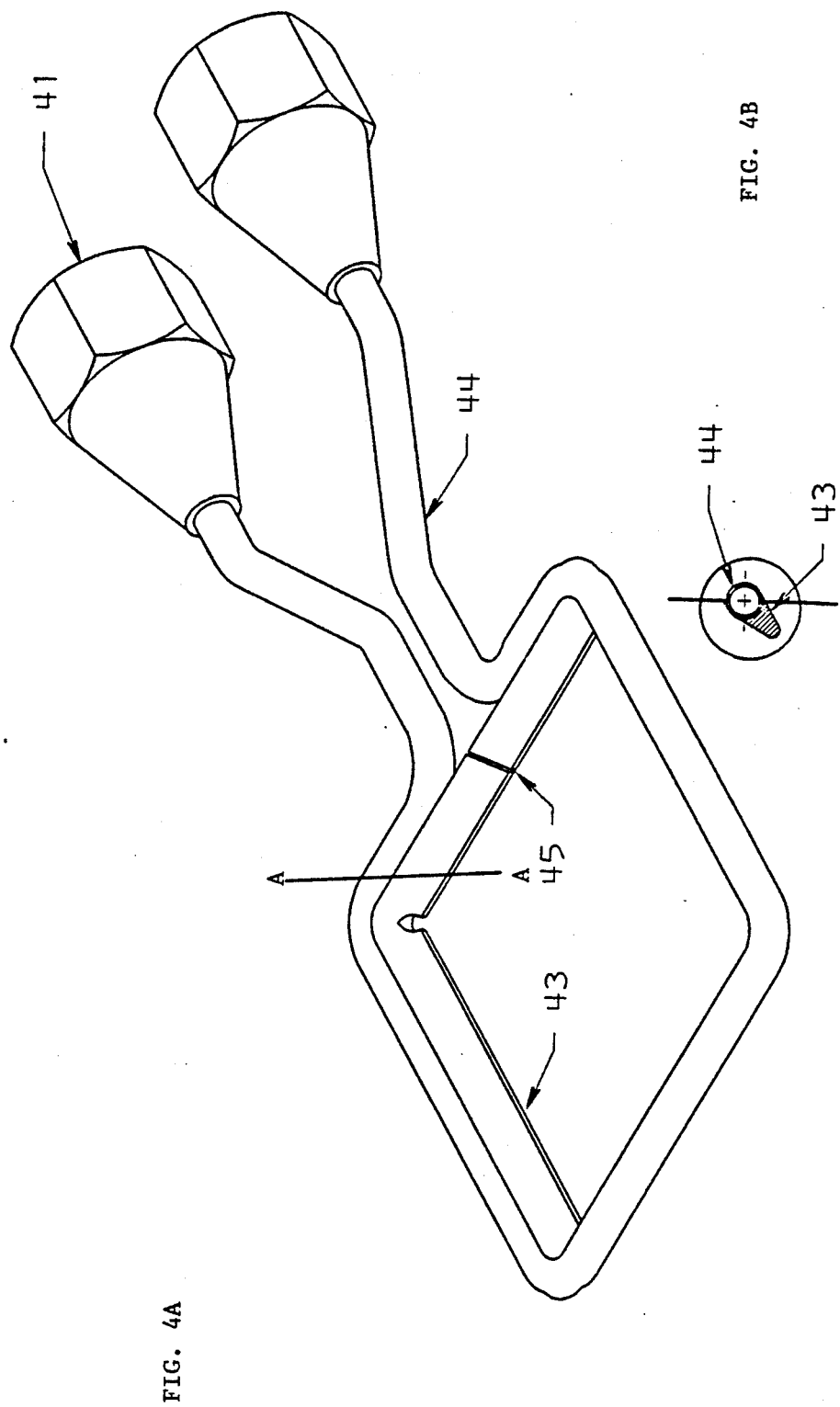
FIG. 4a is a perspective view of the RF coil in the RF encapsulation apparatus.
FIG. 4b is a cross sectional view of the RF coil in the RF encapsulation apparatus.

FIG. 4 shows a perspective view of the RF coil 39 used in the preferred embodiment of the encapsulation apparatus. The RF coil 39 portrayed in FIG. 4 is a single turn coil made of a copper ring concentrator 43 brazed on a coil of copper tubing 44. A multiple turn coil could be used according to the principles of the present invention and would have an added advantage of not requiring an RF matching transformer required by the single turn coil coupled to the RF generator (both not shown). However, the single turn coil 39 is easier to incorporate and seal in the encapsulation apparatus. Flare nuts 41 connect the RF coil 39 to the RF generator output.

Without water or other coolant flowing through the coil tubing 44, there is a danger of the RF coil 39 overheating and melting. The concentrator 43 focuses the RF current to the lip of the cap 15 and the sealband 17. The RF coil concentrator 43 is necessary for accurate distribution of the RF current to the lip of the cap 15 for uniform heating for the sealband 17 to control the solder flow and assure a uniform solder distribution. Without the concentrator 43, the magnetic field would be more dispersed, creating a greater chance of the circuitry on the chip 11 and substrate 13 to be affected. The concentrator 43 has a gap 45 to prevent shorting in the RF coil 39.

Figure 5:
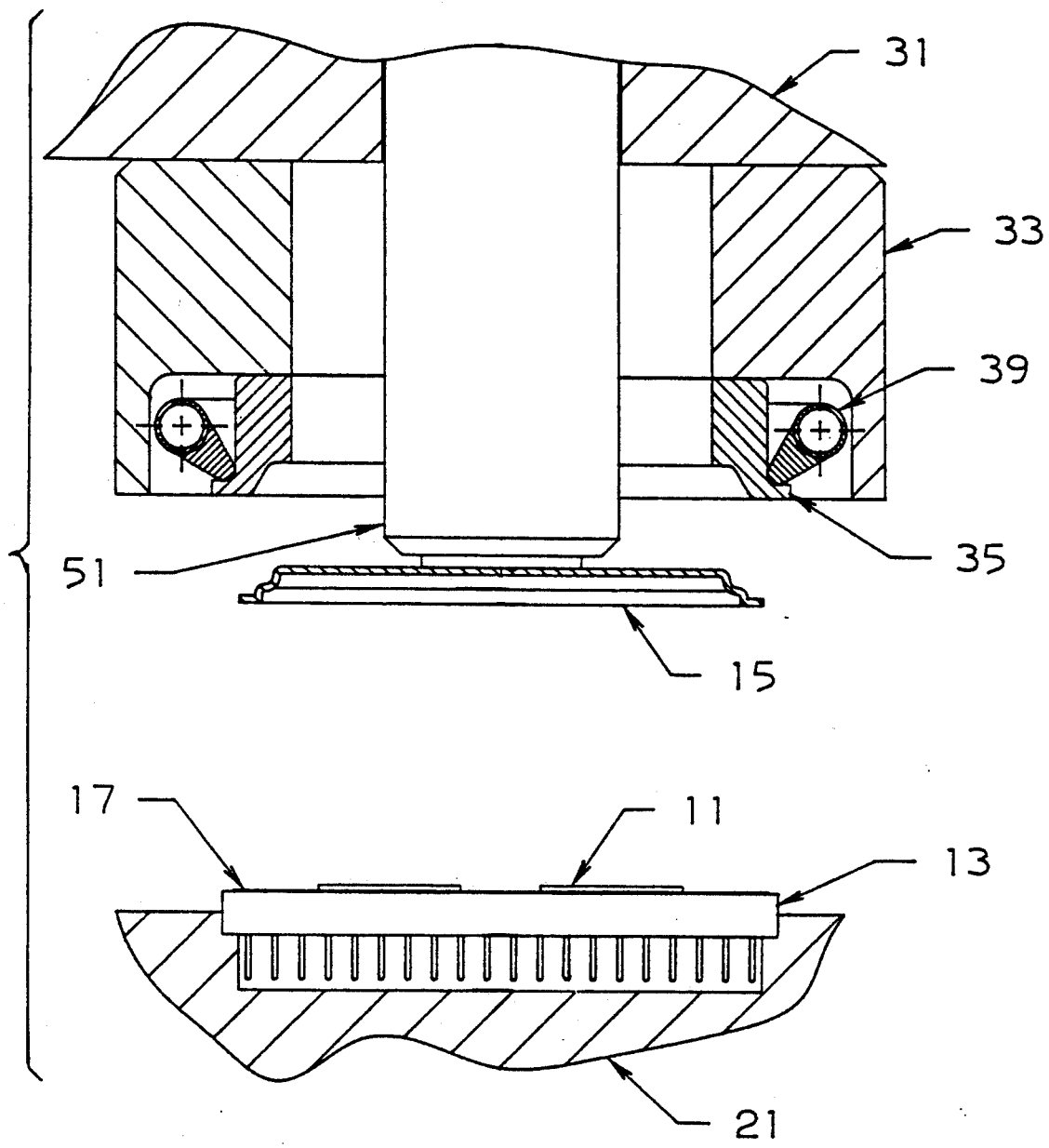
FIG. 5 is a cross sectional view of a slightly modified version of the RF encapsulation apparatus to be used for disassembly of a completed ceramic module assembly.

FIG. 5 shows a modified RF encapsulation tool which can be used to disassemble a completed module assembly which as failed electrical or physical testing. Most of the configuration remains the same as that shown in FIGS. 2 and 3 except that the chamber plate 37 and O-ring 27 are no longer needed as the integrity of the sealband 17 is not an issue on rework of the module. The ceramic pressure plate 35 is also not required to provide pressure on the cap 15 and is modified to accept a central holder 41 which retains the cap 15 after the sealband 17 has been melted by the RF coil 39. The holder 15 could be a magnet for ferrous-based caps or a vacuum holder for non-ferrous caps.

The operation of the modified tool shown in FIG. 5 is similar to that described above in conjunction with FIGS. 2 and 3. In this case, however, a completed module assembly is placed in the ceramic nest 21, rather than an unbonded substrate an cap used above. The lower assembly 20 is raised until the cap 15 is in contact with the holder 51 and the pressure plate 35. In this embodiment, the pressure plate 35 primarily fulfills a positioning function for the sealband 17 with respect to the RF coil 39. The RF coil 39 is energized by the high frequency generator and melts the sealband 17. The holder 51 prevents the cap 15 from descending with the substrate 13 and separation of the module assembly is accomplished. After the substrate 13 is removed, the holder 51 can be lowered to allow for easier removal of the cap 15.

While the invention has been described with respect to particular embodiments above, it would be understood by those skilled in the art that modifications may be made without departing from the spirit and scope of the present invention. For example, other chamber and RF coil designs are possible, there is no necessity that the RF coil be part of an upper assembly so long as the RF field is concentrated at the lip of the cap and sealband. These embodiments are for purposes of example and illustration only, an are not to be taken to limit the scope of the invention narrower than the scope of the appended claims.

I claim:

1. A method of encapsulating a ceramic substrate having at least one semiconductor chip joined thereon with a protective cap through the use of RF induction heating to melt a sealband placed in contact with said substrate and said cap near the periphery of said cap, comprising the steps of:

positioning said cap over said substrate so that said sealband is in contact with said cap near its periphery;

placing said cap and said substrate in a substantially airtight chamber;

forcing said cap and said substrate together to promote a good bond between said cap and said substrate, simultaneously forcing said cap in thermal contact with said sealband;

inducing a current in said cap with an electromagnetic field in an RF spectrum, said electromagnetic field concentrated at said cap near its periphery to reduce effects of said electromagnetic field on circuitry on said substrate and chip and to reduce power requirements, thereby heating said cap by induction heating and said sealband melts; and, creating air pressure within said chamber to prevent heated air within said cap from breaching said molten sealband until said sealband cools and solidifies.

2. The method as recited in claim 1 wherein said protective cap is composed of a metallic material.

3. The method as recited in claim 1 wherein said air pressure is created by introducing an inert gas into said chamber.

4. The method as recited in claim 1 wherein a current is induced in said sealband as well as in said cap by said electromagnetic field.

5. A method of encapsulating a ceramic substrate having at least one semiconductor chip joined thereon with a protective cap through the use of RF induction heating to melt a metallic sealband placed in contact with said substrate and said cap near the periphery of said cap, comprising the steps of:

positioning said cap over said substrate so that said metallic sealband is in contact with said cap near its periphery;

placing said cap and said substrate in a substantially airtight chamber;

forcing said cap and said substrate together to promote a good bond between said cap and said substrate, inducing a current in said sealband with an electromagnetic field in an RF spectrum, thereby melting said sealband by induction heating, said electromagnetic field concentrated at said cap near its periphery and said sealband to reduce effects of said electromagnetic field on circuitry said substrate and chip and to reduce power requirements; and, creating air pressure within said chamber to prevent heated air within said cap from breaching said molten sealband until said sealband cools and solidifies.

6. The method as recited in claim 5 wherein said protective cap is composed of a metallic material.

7. The method as recited in claim 5 wherein said air pressure is created by introducing an inert gas into said chamber.

* * * * *